United States Patent [19]
Nogami et al.

[11] Patent Number: 4,905,192
[45] Date of Patent: Feb. 27, 1990

[54] SEMICONDUCTOR MEMORY CELL

[75] Inventors: Kazutaka Nogami, Kawasaki; Takayasu Sakurai, Tokyo, both of Japan

[73] Assignee: Kabushiki Kaisha Toshiba, Kawasaki, Japan

[21] Appl. No.: 175,252

[22] Filed: Mar. 30, 1988

[30] Foreign Application Priority Data

Mar. 31, 1987 [JP] Japan .................................. 62-79156

[51] Int. Cl.$^4$ ............................................... G11C 8/00
[52] U.S. Cl. .................................... 365/200; 365/194; 365/195
[58] Field of Search ....................... 365/200, 194, 195; 371/10

[56] References Cited

U.S. PATENT DOCUMENTS 4,723,227  2/1988  Murotani ............................. 365/200

OTHER PUBLICATIONS

Kokkonen et al., "Redundancy Techniques for Fast Static RAMs," ISSCC Digest of Technical Papers, Feb. 1981, pp. 80–81.
Eaton et al., "A 100ns 64K Dynamic RAM Using Redundancy Techniques," ISSCC Digest of Technical Papers, Feb. 1981, pp. 84–85.

Primary Examiner—Joseph A. Popek
Attorney, Agent, or Firm—Foley & Lardner, Schwartz, Jeffery, Schwaab, Mack, Blumenthal & Evans

[57] ABSTRACT

A semiconductor memory device includes a memory cell array, a spare memory cell array, a first addressing circuit for designating an address of the memory cell array; a second addressing circuit for designating an address of the spare memory cell array, a drive circuit for activating a select line designated by each of the first and second addressing circuits, a program circuit for generating a predetermined output based on whether the memory cell array has a defect or fault or not, and a select circuit responsive to an output from the program circuit for supplying an activation signal to the designated select line at an earlier timing when there is no fault in the memory array cell, and supplying an activation signal delayed by a time necessary for the selection of the spare memory cell array when there is a fault in the memory cell array.

7 Claims, 7 Drawing Sheets

SEMICONDUCTOR MEMORY CELL

BACKGROUND OF THE INVENTION

The present invention relates to a semiconductor memory cell of a large capacity having a redundancy circuit.

A redundancy circuit is now widely used in a memory device of a large capacity such as dynamic RAMs (hereinafter called DRAM) to improve the production yield.

A redundancy circuit includes additional spare memory cells and a spare decoder/word-driver for selecting a spare memory cell, which are used when a part of the ordinary memory cells is found to be defective.

If a designated address corresponds to a defective memory cell in a semiconductor memory device having a redundancy circuit of this type, a decoder and a spare decoder are activated to select a word line or a spare word line. A decoder inhibit signal is generated by the spare decoder so as not to select a word line, and a word line drive signal is generated by a word line driver to drive a spare word line. In this case, in order to prevent destruction of cell data, it is important to supply a word line drive signal only after a decoder output has become definite. In view of this, also a word line activation signal is supplied after the decoder output has become definite.

However, all of the bits in a semiconductor memory device having a redundancy circuit often operate normally, so that it becomes unnecessary to use the redundancy circuit. In such a case, the normal decoder output "H" level is not replaced with "L" level, but the timing of outputting a word line activation signal WA is delayed by a time $t_{inh}$ irrespective of whether this signal can be supplied if once the normal decoder output is determined as the "H" level. The reason for this is that the timing is set on the assumption that a spare word line may be selected under any conditions. The time $t_{inh}$ is the period from the instant when the normal decoder output is determined to the instant when the normal decoder output assumes the "L" level to use the spare circuit. In other words, the access time is delayed by time $t_{inh}$.

The access delay due to the redundancy circuit presents a serious overhead of a high speed, large capacity memory, particularly DRAMs, in terms of high speed performance.

In a conventional semiconductor memory device having a redundancy circuit, the operation timings are determined on the assumption that the redundancy circuit will always be used, to thereby pose the problem of access delay when the redundancy circuit is not used.

SUMMARY OF THE INVENTION

It is an object of the present invention to provide a semiconductor memory device with a redundancy circuit capable of realizing a high speed access when it is not necessary to use the redundancy circuit.

It is another object of the present invention to provide a semiconductor memory device capable of setting optimum timings in both cases where the redundancy circuit is used and not used.

The above and other objects are achieved by a semiconductor memory device of this invention, which comprises: a memory cell array having a spare memory cell array; first addressing means for designating an address of said memory cell array; second addressing means for designating an address of the spare memory cell array; drive means for activating a select line designated by each of said first and second addressing means; a program circuit for generating a predetermined output based on whether the memory cell array has a defect or fault or not; and a select circuit responsive to an output from the program circuit for supplying an activation signal to said designated select line at an earlier time when there is no defect or fault in the memory array cell, and supplying an activation signal delayed by a time necessary for the selection of the spare memory cell array when there is a fault in said memory cell array.

A variable delay circuit may be used instead of the select circuit.

A programmable and variable delay circuit, whose delay time is changed on the basis of the presence/absence of a memory cell fault, may be used instead of the program circuit.

The program circuit is a kind of memory which stores the status of memory cell fault. Based on an output from the program circuit, the select circuit selects an output timing of a select line activation signal. For instance, if there is no memory cell defect or fault, a select line is driven without any delay. Thus, a conventional timing delay on the assumption of always using the redundancy circuit is eliminated to make possible a high speed access.

Therefore, according to the present invention, a large capacity memory having a redundancy circuit can have optimum timings in both cases where the redundancy circuit is used and not used. A loss of access time particularly when the redundancy circuit is not used can be eliminated as compared with a conventional memory wherein the redundancy circuit is assumed to be used under any conditions.

Preferred embodiments of the present invention will now be described in detail with reference to the accompanying drawings.

DETAILED DESCRIPTION

A conventional semiconductor memory device will first be described as conducive to a better understanding of the present invention.

Figure 1:
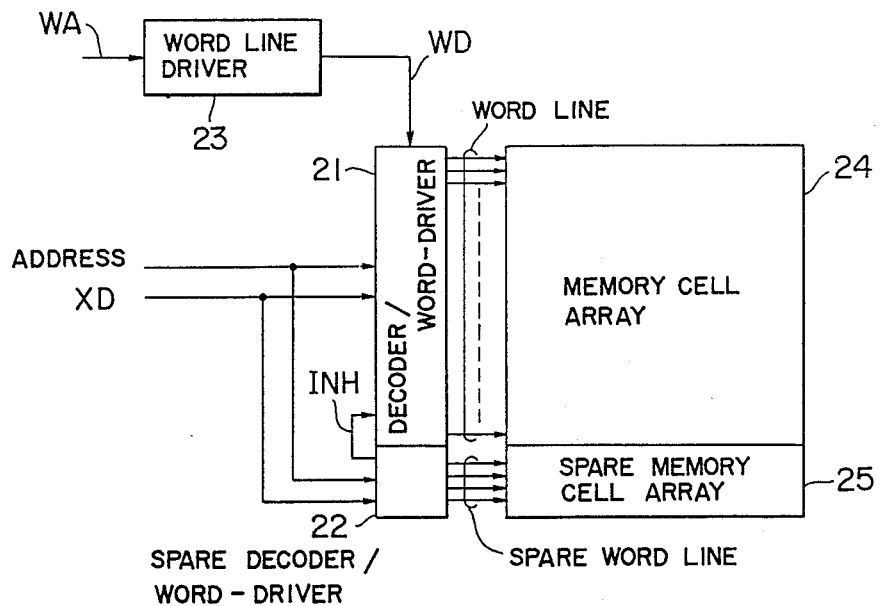
FIG. 1 is a block diagram showing the structure of a conventional semiconductor memory device having a spare memory array.

FIG. 1 is a block diagram showing an example of the structure of a DRAM having a row redundancy circuit.

A decoder/word-driver 21 receives an address and a decoder activation signal XD to select one or more of word lines which are driven by a word line drive signal WD with a potential raised by the driver. A spare decoder/word-driver 22 receives the same address and decoder activation signal XD to select a spare word line on the condition that the input address coincides with the address of a defective memory cell, which address has been programmed in the decoder/word-driver 22, and thereafter the spare decoder/word-driver 22 supplies a decoder inhibit signal INH to the decoder/word-driver 21. When the decoder inhibit signal INH assumes the "H" level, the decoder/word-driver 21 causes all the word lines not to be selected.

When a word line activation signal WA assumes the "H" level, a word line driver 23 generates a word line drive signal raised to the power supply voltage or a higher voltage. Thus, the read/write operation of the memory cell is completed.

Figure 2:
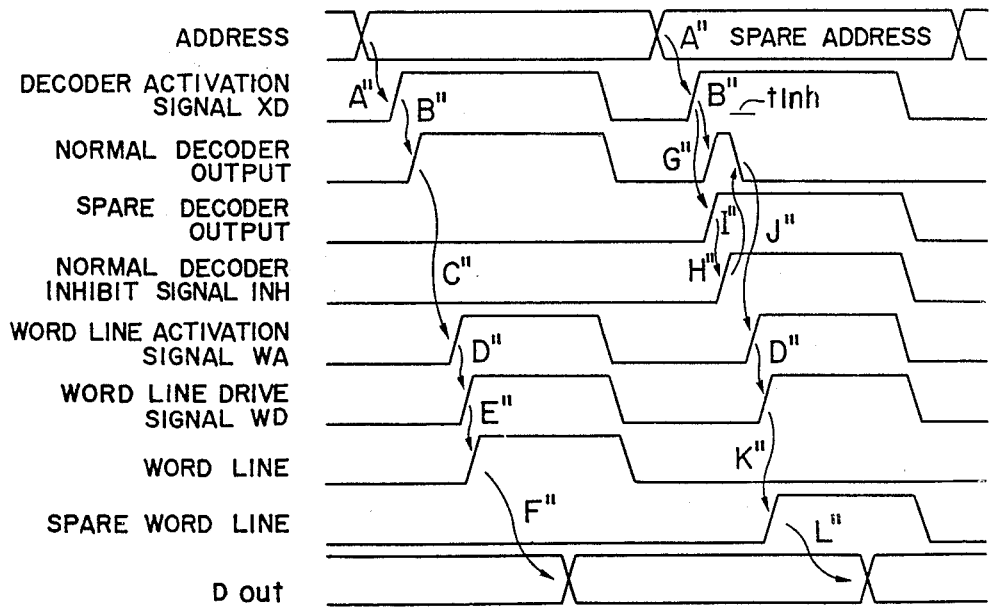
FIG. 2 is a timing chart showing the operation of the device shown in FIG. 1.

FIG. 2 is a timing chart showing the operation of the memory device constructed as shown in FIG. 1.

(i) When an Ordinary Word Line is Selected

After a selection address becomes definite, a decoder activation signal XD assumes the "H" level (A''). One or more of normal decoder outputs assume the "H" level (B'') in accordance with the selection address. After the normal decoder output becomes definite, a word line activation signal WA (C'') is outputted. In response to the output, a word line drive signal WD (D'') is outputted to drive the word line (E''). After the word line assumes the "H" level, output data Dout (F'') are outputted from a sense circuit (not shown) to a data line (not shown).

(ii) When a Spare Word Line is Selected

After an address becomes definite, a decoder activation signal XD assumes the "H" level (A''). One or more of normal decoder outputs assume the "H" level (B''). In this case, the inputted address corresponds to a fault memory cell, i.e., to the address programmed in the spare decoder/word-driver 22. Therefore, the spare decoder output also assumes the "H" level (G''). Then, a normal decoder inhibit signal INH assumes the "H" level (H'') in accordance with the spare decoder output so that the normal decoder output assumes the "L" level (I'') to prevent the ordinary memory cell array from being driven. The word line activation signal WA for use in read/write operation is outputted (J'') at a properly delayed-time after the normal decoder output has been completely replaced with the spare decoder output. In response to the output of the word line activation signal WA, a word line drive signal WD (D'') is outputted to drive the spare word line (K'') and output data (L'').

With the above arrangement, however, a malfunction will occur if a word line drive signal is inputted to the decoder/word-driver before a decoder output becomes definite. Thus, it is necessary for the word line activation signal WA to be outputted with timing having a sufficient time for allowing a spare word line, if any, to be selected after the spare decoder output becomes definite at a later time than that for the normal decoder output.

Figure 3:
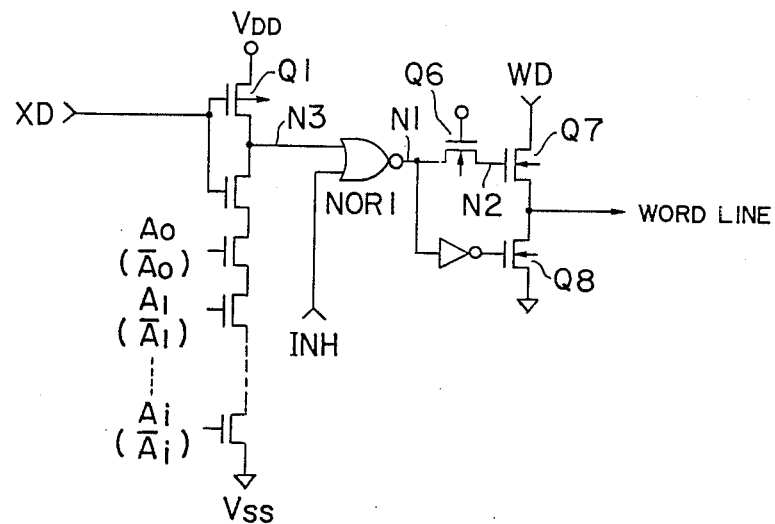
FIG. 3 is a circuit diagram showing an example of a decoder/driver circuit.

The above circumstances will be explained with reference to an example of the decoder/word-driver shown in FIG. 3. While the decoder activation signal XD is at the "L" level, node N3 is precharged to the power supply voltage $V_{DD}$ through a p-channel transistor Q1 and assumes the "H" level. When all the address inputs A0 ($\overline{A0}$), A1 ($\overline{A1}$) ..., Ai ($\overline{Ai}$) are at the "H" level, node N3 has a ground potential $V_{SS}$ through discharge. At this time, if the normal decoder inhibit signal INH is at the "L" level, the decoder output at node N1 reaches the "H" level via a NOR gate NOR 1. If on the other hand the normal decoder inhibit signal INH is at the "H" level, the decoder output at node N1 assumes the "L" level.

Only when the decoder output at node N1 is at the "H" level, does node N2 reach the "H" level so that upon input of a word line drive signal WD, it is derived out of an n-channel transistor Q7. However, assuming that the levels of the decoder output at node N1 and an output at node 2 are not definite as to whether they take the "H" or the "L" level, and remain at an intermediate level between $V_{DD}$ and $V_{SS}$, then a word line which is not selected will be driven to the intermediate level higher than $V_{TH}$ (threshold value of n-channel transistor). As a result, the transfer gate of a memory cell is opened and the cell data are destroyed.

Therefore, it is necessary as discussed previously to supply a word line activation signal after a decoder output has become definite.

Figure 4:
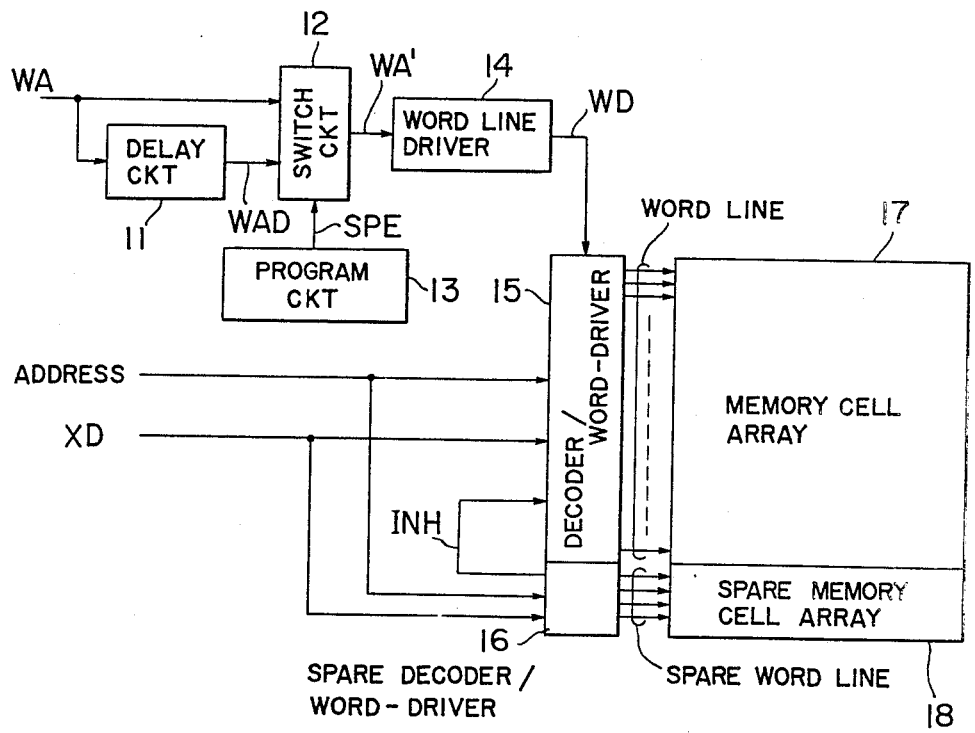
FIG. 4 is a block diagram showing the structure of a semiconductor memory device according to an embodiment of this invention.

FIG. 4 is a block diagram showing the structure of a semiconductor memory device according to an embodiment of this invention. This embodiment differs from a conventional device shown in FIG. 1 in that a delay circuit 11, a switch circuit 12 and a program circuit 13 are additionally provided.

A word line activation signal WA is applied directly to the switch circuit 12 and via the delay circuit 11 to the switch circuit 12. The switch circuit 12 selects the word line activation signal WA or the delayed word line activation signal WAD in accordance with an output SPE from the program circuit 13, and outputs the selected one as a select word line activation signal WA'.

Figure 5:
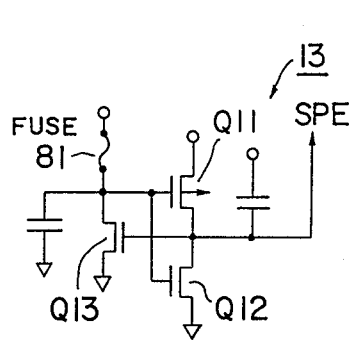
FIG. 5 is a circuit diagram showing the structure of the program circuit shown in FIG. 4.

The program circuit 13 stores the status of whether there is any defect or fault in the ordinary memory cell array, i.e., whether the spare memory cell is to be used or not. The program circuit may use a circuit made of a fuse type ROM as shown in FIG. 5. This circuit comprises a p-channel transistor Q11 and an n-channel transistor Q12 which are serially connected with their gates connected in common, and a transistor Q13 connected across the gate common interconnection and $V_{SS}$, whose gate is connected to the interconnection of transistors Q11 and Q12. A high voltage is applied to the gate common interconnection via a fuse 81. A signal SPE is outputted from the interconnection of transistors Q11 and Q12.

In this circuit, if the fuse 81 is not blown, the output SPE is fixed at the "L" level. On the other hand, if the fuse 81 is blown upon radiation of a laser beam, the circuit is latched after power-on so that the output SPE is fixed at the "H" level. Whether the fuse is caused to be blown or not depends on the memory test result.

The delay circuit 11 generates a delay time $t_{inh}$ which has a period from the instant when the normal decoder output becomes "H" level after address input to the instant when the normal decoder output definitely assumes the "L" level upon input of a normal decoder inhibition signal INH from the spare decoder/word-driver 16.

Figure 6:
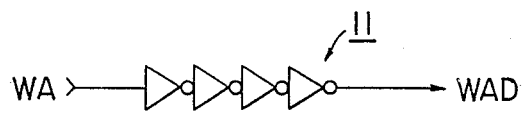
FIGS. 6, 7, and 8 are circuit diagrams showing structures of the delay circuit of FIG. 4.
Figure 7:
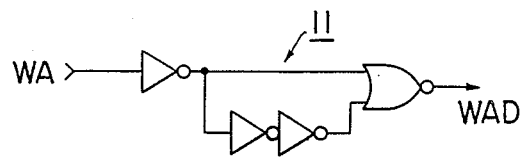
Figure 8:
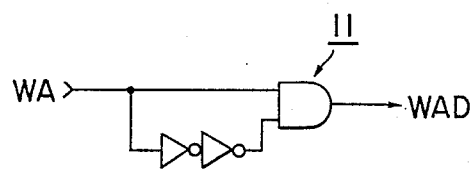

Examples of the delay circuit 11 are an even number of serially connected inverters as shown in FIG. 6, a NOR output circuit between signal WA and a signal delayed by an even number of serially connected inverters as shown in FIG. 7, and an AND output circuit therebetween as shown in FIG. 8. The latter two circuits have an advantage in that it is possible to further delay by the amount of the rise time of the word line activation signal and remove the delay of the fall time of the word line after being subjected to the delay circuit, thereby to lengthen the precharge time.

The switch circuit 12 selects the word line activation signal WA or the delayed word line activation signal WAD via the delay circuit in accordance with the output SPE from the program circuit 13. The selected word line activation signal WA' is applied to the word line driver 14. The output timing of the word line activation signal WA is set at the time when the normal decoder output, without using the redundancy circuit, becomes definite after address input.

Figure 9:
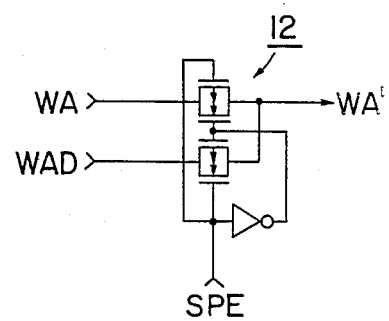
FIGS. 9, 10, and 11 are circuit diagrams showing structures of the switch circuit of FIG. 4.
Figure 10:
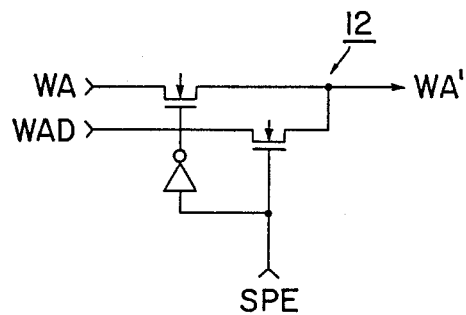

Use of a complementary transfer gate circuit as shown in FIG. 9 as the switch circuit 12 affords a large amplitude of the selected word line activation signal WA', the amplitude extending from $V_{SS}$ to $V_{DD}$. Alternatively, use of two n-channel transfer gates for selecting WA or WAD in accordance with SPE or SPE as shown in FIG. 10, results in a smaller amplitude from $V_{SS}$ to ($V_{DD}-V_{TH}$, corresponding to a threshold value of nchannel transistor). However, this circuit has a smaller number of elements to thus permit a high degree of integration.

Figure 11:
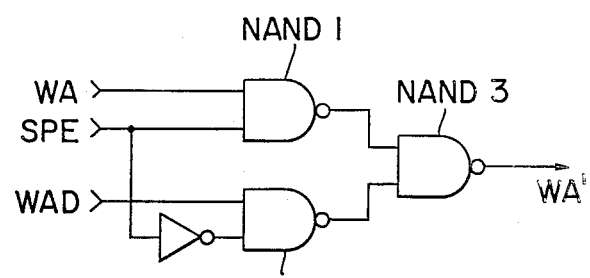

Another example of the switch circuit shown in FIG. 11 comprises a NAND gate NAND 1 with WA and $\overline{SPE}$ inputted, a NAND gate NAND 2 with WAD and SPE inputted, and a NAND gate NAND 3 with the outputs of NANDs 1 and 2 inputted, whereby an output WA' is derived out of NAND gate 3.

The operation of the semiconductor memory device of this embodiment will be described in detail with reference to the timing chart shown in FIG. 12.

(i) When Redundancy Circuit Is Not Used.

Figure 12:
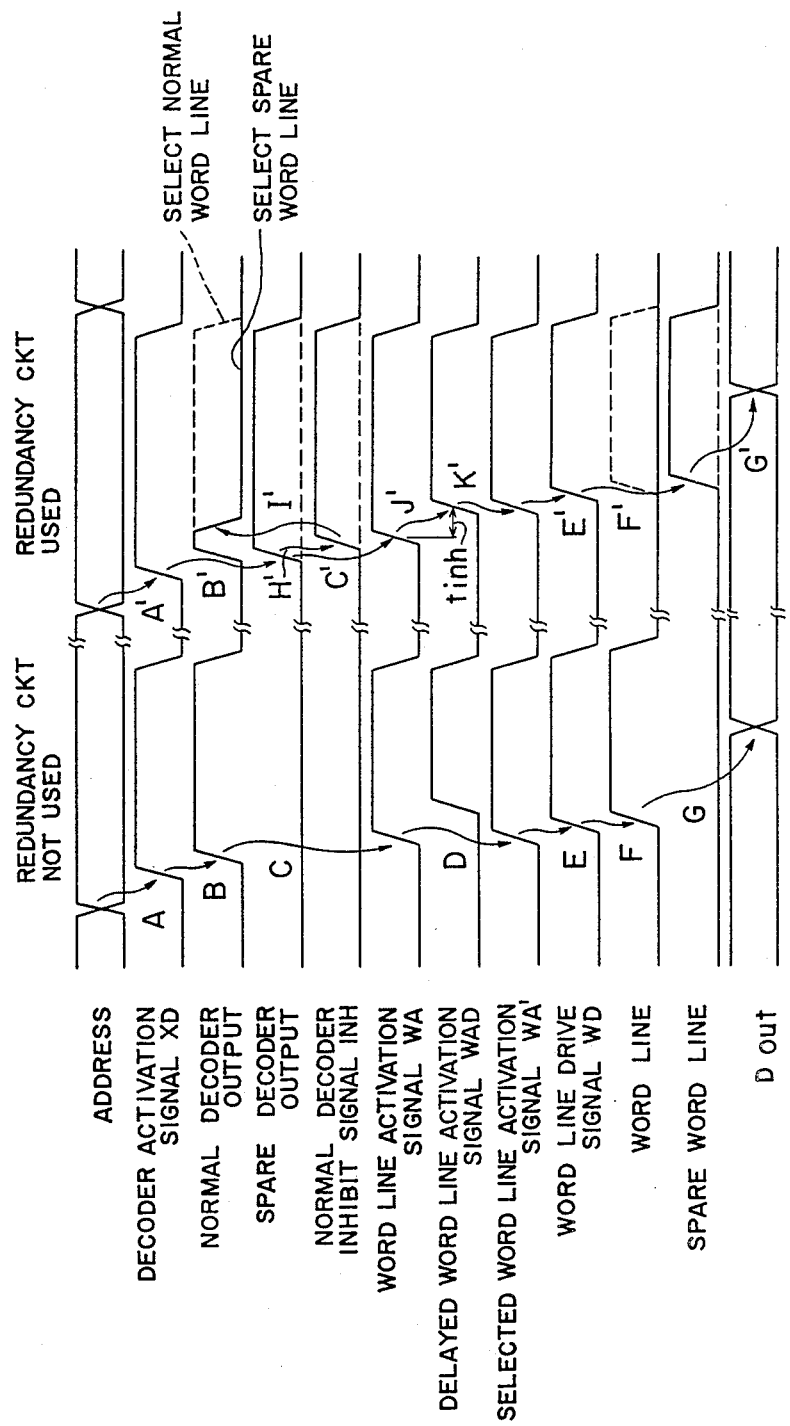
FIG. 12 is a timing chart showing the operation of the memory device shown in FIG. 4.

This operation is shown at the left side of the flow chart of FIG. 12.

After an address becomes definite, a decoder activation signal XD is outputted (A) so that the normal decoder output becomes definite (B). At this time, a word line activation signal WA is outputted (C). Since the redundancy circuit is not used, a fuse in the program circuit 13 remains connected. Thus, the output SPE is at the "L" level, so that the switch circuit 12 does not select the signal from the delay circuit 11. The word line activation signal WA is accordingly inputted to the word line driver 14 (D) to output a word line drive signal WD (E) and open a word line (F). At the time when the word line opens, the sense circuit and data transfer circuit (both not shown) start operating to output data (G).

In the above case, since the word line activation signal WA is outputted at an optimum timing instant after both the normal decoder output and the word line drive signal WD become definite, data access at maximum speed becomes possible.

(ii) When Redundancy Circuit Is Used

This operation is shown at the right side of the timing chart, wherein solid lines represent the case of selecting a spare word line, and broken lines for comparison purposes represent the case of selecting an ordinary word line.

After an address becomes definite, a decoder activation signal XD is outputted (A') so that the spare decoder output becomes definite (B'). After selecting the spare decoder, an ordinary decode inhibiting signal INH is outputted (H') to change the already selected normal decoder output into the "L" level (I'). A word line activation signal WA is outputted at the timing instant of outputting the spare decoder output (C'). Since the signal SPE of the "H" level is being outputted from the program circuit 13, the switch circuit 12 selects the signal from the delay circuit 11 so that the word line activation signal WAD delayed by the delay circuit 11 by time $t_{inh}$ is inputted to the word line driver 14 (J'). Therefore, the word line drive signal is outputted later than in the case of not using the redundancy circuit, i.e., at the timing instant when the normal decoder output definitely assumes the "L" level, to accordingly have a sufficient timing margin. Thereafter, a spare word line opens F') to output data (G'). The timings are set to be most suitable for the case of using the redundancy circuit, thus allowing maximum speed of data access.

As will be appreciated from the above description, optimum timings can be presented in both the cases where the redundancy circuit is used and not used, thus ensuring maximum speeds of data access in both the cases.

Figure 13:
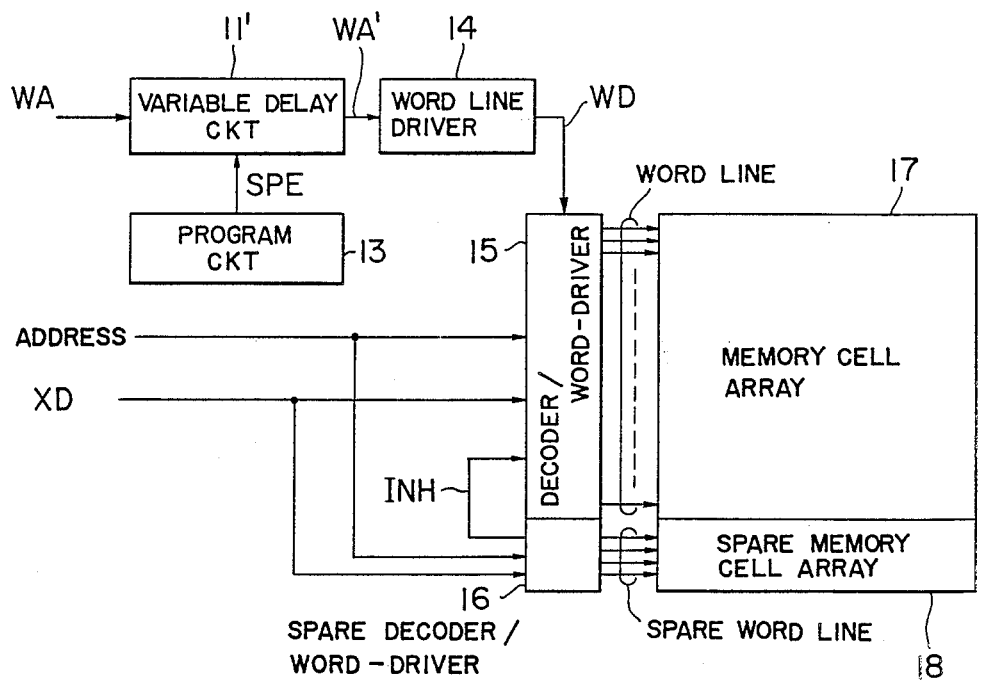
FIG. 13 is a block diagram showing a semiconductor memory device according to another embodiment of this invention.

FIG. 13 is a block diagram showing another embodiment of a semiconductor memory device according to the present invention. This embodiment has an arrangement similar to that shown in FIG. 4 except that the delay time of a variable delay circuit 11' is changed with an output SPE from the program circuit 13, and the word line activation signal WA delayed by the changed delay time is inputted to the word drive circuit 14.

The variable delay circuit 11' can set the delay time smaller when the output SPE of the program circuit 13 is at the "L" level, and larger when the output SPE is at the "H" level.

Figure 14:
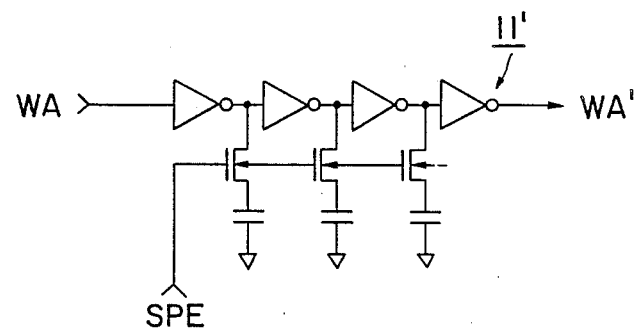
FIGS. 14 and 15 are circuit diagrams showing structures of the variable delay circuit of FIG. 13.

FIG. 14 shows an example of the variable delay circuit 11' wherein a capacitance is added when the output SPE is at the "H" level to make the delay large. Since this circuit has a smaller number of elements, the circuit can be fabricated with a smaller area than that of the circuit of FIG. 4, thus avoiding an increase in chip area which should be kept at a minimum.

Figure 15:
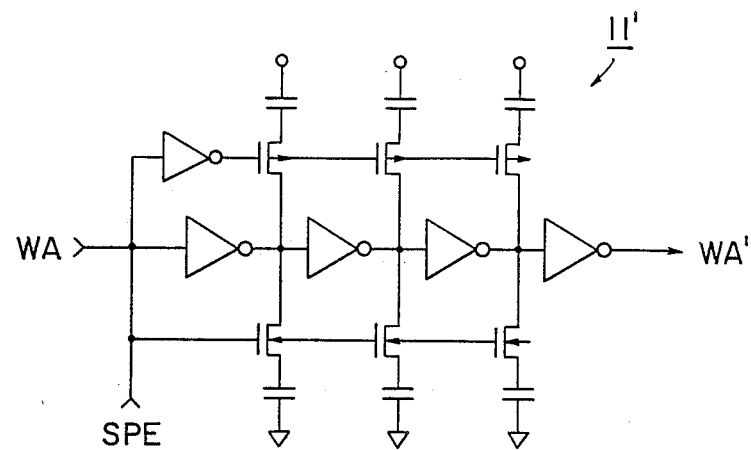

FIG. 15 shows a CMOS version of the circuit shown in FIG. 14, wherein p-channel transistors to whose gates an inverted signal $\overline{SPE}$ is supplied are connected serially to n-channel transistors.

Figure 16:
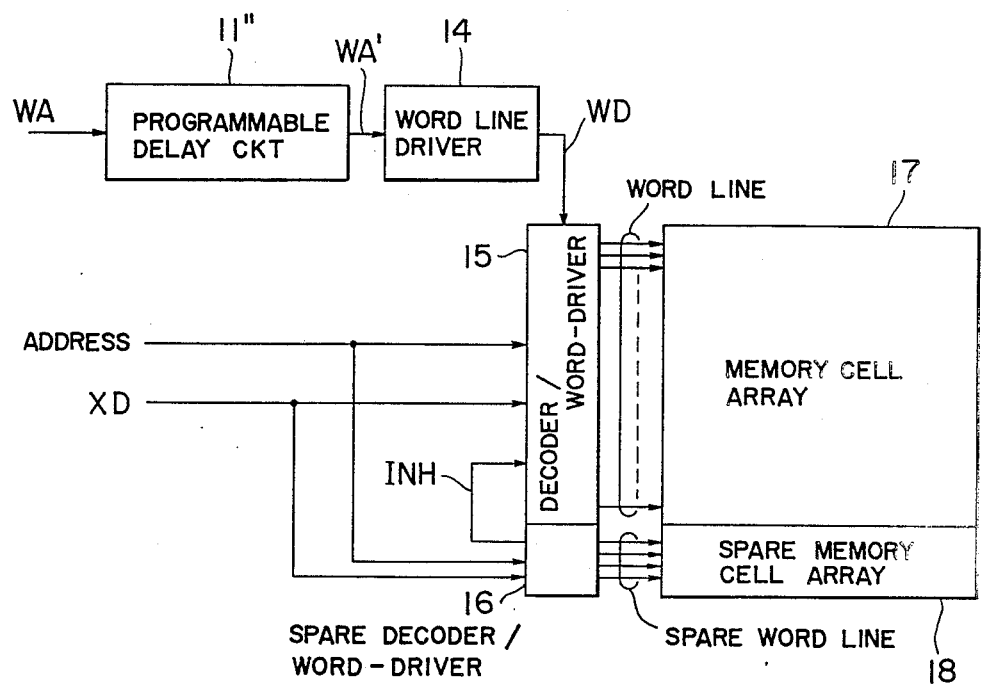
FIG. 16 is a block diagram showing a semiconductor memory device according to a further embodiment of this invention.

FIG. 16 is a block diagram showing a modified circuit of the device shown in FIG. 13, wherein the variable delay circuit 11' and the program circuit 13 of FIG. 13 are combined to form a programmable and variable delay circuit 11''.

Figure 17:
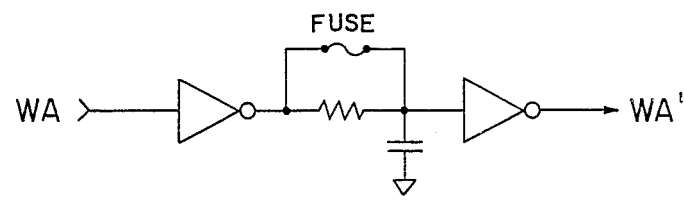
FIGS. 17 to 20 are circuit diagrams showing structures of the programmable and variable delay circuit of FIG. 16.
Figure 18:
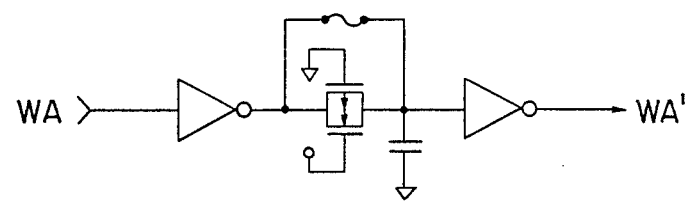
Figures 19, 20:
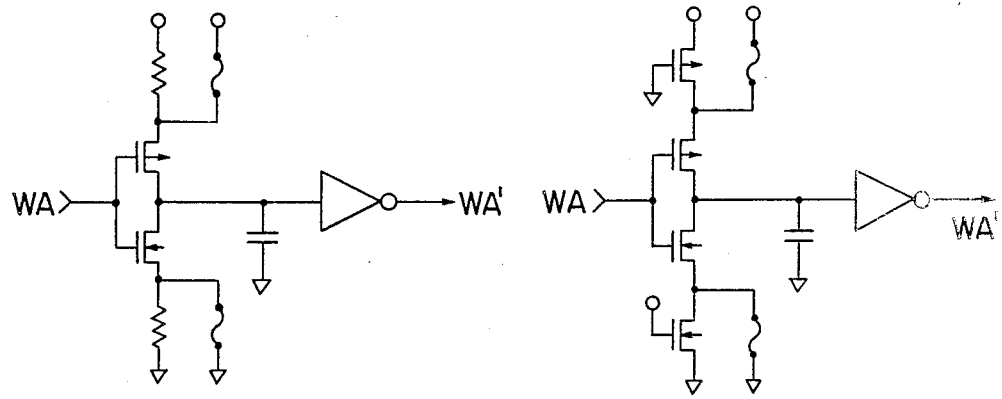

Various examples of the programmable and variable delay circuit can be envisioned. Among them are a circuit shown in FIG. 17 wherein a parallel combination of a fuse and a resistor is connected at an intermediate point in a series of delay inverters, a circuit shown in FIG. 18 wherein a parallel combination of a fuse and a CMOS transfer gate is connected at an intermediate point in a series of delay inverters, a circuit shown in FIG. 19 wherein one of the series of delay inverters is replaced by a resistor load CMOS inverter which has fuses each connected between $V_{DD}$ or $V_{SS}$ and an interconnection between the load resistor and the transistor, and a circuit shown in FIG. 20 wherein one of the series of delay inverters is replaced by an active load CMOS inverter which has fuses each connected between $V_{DD}$ or $V_{SS}$ and an interconnection between the active transistor and the load transistor.

The operations of the circuits shown in FIGS. 13 to 16 are substantially the same as that of the circuit shown in FIG. 4, so the description therefor is omitted.

In the above disclosure, driving a word line has been described. However, driving a bit line can also be performed in exactly the same manner as described above.

Further, the switch circuit, variable delay circuit, and programmable and variable delay circuit in the above described embodiments of the invention can switch between two states only. However, the number of states may be three or more. For example, they may switch among four states including (a) using a redundancy circuit in selecting a row, (b) using a redundancy circuit in selecting a column, (c) not using a redundancy circuit in selecting both a row and a column, and (d) not using a redundancy circuit at all. In such a case, a two-bit memory must be used for the program circuit.

What is claimed is:

1. A semiconductor memory device comprising:
   a memory cell array having a spare memory cell array;
   first addressing means for designating an address of said memory cell array;
   second addressing means for designating an address of said spare memory cell array, said second addressing means being activated simultaneously with said first addressing means;
   drive means for activating a select line designated by each of said first and second addressing means;
   a program circuit for generating a predetermined output based on whether said memory cell array has a defect or fault or not; and
   a select circuit responsive to said output from said program circuit for supplying an activation signal delayed by a delay circuit to said designated select line for the selection of said spare memory cell array when there is a fault in said memory cell array.

2. A semiconductor memory device according to claim 1, wherein said select circuit is a switch circuit which selects one of an activation signal and a delayed activation signal passed through said delay circuit, in accordance with an output from said program circuit.

3. A semiconductor memory device according to claim 1, wherein said program circuit has a fuse, the output of said program circuit being changed depending on whether said fuse was blown or not.

4. A semiconductor memory device according to claim 1, wherein said select line is a word line or a bit line.

5. A semiconductor memory device comprising:
   a memory cell array having a spare memory cell array;
   first addressing means for designating an address of said memory cell array;
   second addressing means for designating an address of said spare memory cell array, said second addressing means being activated simultaneously with said first addressing means;
   drive means for activating a select line designated by each of said first and second addressing means;
   a program circuit for generating a predetermined output based on whether said memory cell array has a defect or fault or not; and
   a variable delay circuit responsive to an output from said program circuit supplying an activation signal delayed by a delay circuit to said designated select line for the selection of said spare memory cell array when there is a fault in said memory cell array.

6. A semiconductor memory device comprising:
   a memory cell array having a spare memory cell array;
   first addressing means for designating an address of said memory cell array;
   second addressing means for designating an address of said memory cell array;
   second addressing means for designating an address of said spare memory cell array, said second addressing means being activated simultaneously with said first addressing means;
   drive means for activating a select line designated by each of said first and second addressing means;
   a program circuit for generating a predetermined output based on whether said memory cell array has a defect or fault or not; and
   a programmable delay circuit responsive to said output for supplying an activation signal to said designated select line for the selection of said spare memory cell array when there is a fault in said memory cell array.

7. A semiconductor memory device according to claim 6, wherein said programmable delay circuit has a fuse, one of a series of delay stages of said programmable delay circuit being caused to undergo its delay operation depending on whether said fuse was blown or not.

* * * * *